United States Patent [19]
Matsuoka et al.

[11] Patent Number: 5,960,182
[45] Date of Patent: Sep. 28, 1999

[54] HARDWARE-SOFTWARE CO-SIMULATION SYSTEM, HARDWARE-SOFTWARE CO-SIMULATION METHOD, AND COMPUTER-READABLE MEMORY CONTAINING A HARDWARE-SOFTWARE CO-SIMULATION PROGRAM

[75] Inventors: Yuichiro Matsuoka; Masami Aihara, both of Kanagawa-ken, Japan

[73] Assignee: Kabushiki Kaisha Toshiba, Kawasaki, Japan

[21] Appl. No.: 08/997,166

[22] Filed: Dec. 23, 1997

[51] Int. Cl.$^6$ ...................................................... G06F 19/00
[52] U.S. Cl. ........................... 395/500; 364/578; 364/488; 364/489; 364/490
[58] Field of Search ............................. 395/500; 364/578, 364/488, 489, 490, 491

[56] References Cited

U.S. PATENT DOCUMENTS

| | | | |
|---|---|---|---|
| 5,493,672 | 2/1996 | Lau et al. .................................. | 395/500 |
| 5,784,593 | 7/1998 | Tseng et al. ............................... | 395/500 |
| 5,801,958 | 9/1998 | Dangelo et al. ........................... | 364/489 |
| 5,809,283 | 9/1998 | Vaidyanathan et al. ................. | 395/500 |

*Primary Examiner*—Kevin J. Teska
*Assistant Examiner*—A. S. Roberts
*Attorney, Agent, or Firm*—Foley & Lardner

[57] ABSTRACT

A hardware verification module performs simulation for hardware verification with input from an RT-level processor model and an RT-level hardware description. All abstraction module abstracts from the RT-level hardware description on a processor input/output instruction operation level to generate an abstracted description describing an instruction-level hardware description. A software verification module performs simulation for software verification with input from an instruction-level processor model and the abstracted description.

24 Claims, 21 Drawing Sheets

FIG. 6A

```
entity ASIC is
port(A : in Bit_Vector(7 downto 0);
     OP : in Bit;
        CLK : in Bit;
        STB : in Bit;
        DONE : out Bit;
        0 : out Bit_Vector(7 downto 0));
end ASIC;

architecture RTL of ASIC is                             41
```
```
type states is (S1,S2,S3,S4,S5,S6,S7,S8);
signal STATE : states : =SI;
```
```
   signal REG1, REG2, ACC : Bit_Vector(7 downto 0);
   signal OREG : Bit;
   signal LD1,LD2,LD3,LA,CLR,ADD,Z,SH: Bit;
begin
```
```
process
begin
      wait until CLK' event and CLK ='1';
      if CLR ='1' then
        REG1 <= "00000000";
      elsif LD1 ='1' then
        REG1 <= A;
      elsif SH ='1' then
        REG1 <= SHL(REG1);
      end if;
end process;

process
begin
      wait until CLK' event and CLK ='1';
      if CLR ='1' then
        REG2 <= "00000000";
      elsif LD2 ='1' then
        REG2 <= A;
      elsif SH ='1' then
        REG2 <= SHR(REG2);
      end if;
end process;
```

FIG. 6B

```
process
begin
    wait until CLK' event and CLK ='1';
    if CLR ='1' then
      ACC <= "00000000";
    elsif LA ='1' then
      if OP <='1' then
        ACC <= REG1 + REG2;
   else
        ACC <= REG1 - REG2;
    end if;
  end if;
end process;

Z <= not (REG2(7) or REG2(6) or REG2(5) or REG(4)
         or REG2(3) or REG2(2) or REG2(1) or REG2(0));

0 <= ACC;
```

```
Controller : process
begin
        wait until CLK' Event and CLK = '1';
        case STATE is
        when S1 =>
            CLR <= '0';
            STATE <= S2;
        when S2 =>
            DONE <= '0';
            LD1 <= '1';
            if STB = '1' then
                STATE <= S2;
            else
                STATE <= S3;
        end if;
          when S3 =>
            LD1 <= '0';
            LD2 <= '1';
            LD3 <= '1';
            if STB = '1' then
                STATE <= S3;
    else
                STATE <= S4;
```

FIG. 6D

```
      end if:
        when S4 =>
            LD2 <= '0';
            LD3 <= '0';
            if op = '1' and Z = '0' then
                STATE <= S2;
    else
                STATE <= S5;
      end if;
        when S5 =>
            LA <= '1';
            STATE <= S6;
        when S6 =>
            LA <= '1';
            STATE <= S7;
        when S7 =>
            LA <= '0';
            SH <= '1';
            if Z <= '1' then
                STATE <= S6;
        else
                STATE <= S8;
      end if;
        when S8 =>
            DONE <= '1';
            STATE <= S2;
    end case;
  end process;
end;
```

FIG. 11A

```
entity ASIC is
PORT (A   : in  Bit_Vector(7 downto 0);
      OP  : in  Bit;
      CLK : in  Bit;
      STB : in  Bit;
      DONE : out Bit;
      O   : out Bit_Vector(7 downto 0));
end ASIC;

architecture INSTRUCTION1 of ASIC is signal REG1, REG2, ACC : Bit_Vector(7 downto 0);
  signal OREG : Bit;
  signal FLG  : Integer := 0;
begin process
  begin if FLG = 0 then
           ACC  <= "00000000";
           REG1 <= "00000000";
           REG2 <= "00000000";
           DONE <= '0';

if STB /= '1' then
           FLG <= 2;
        else
           REG1 <= A;
           if STB /= '1' then
              FLG <= 3;
           else
              REG2 <= A;
              OREG <= OP;

if OP = '0' and REG2 = "00000000" then
                 FLG <= 2;
```

FIG. 11B

```
    else
       ACC <= REG1;
       while(TRUE) loop
            if OREG = '1' then
                ACC <= ACC + REG2;
          else
                ACC <= ACC - REG2;
          end if;
          REG1 <= SHL(REG1);
          REG2 <= SHL(REG2);
                if( (REG2(7) or REG2(6) or REG2(5)
                   or REG2(4) or REG2(3) or REG2(2)
                   or REG2(1) or REG2(0) = '0') then
                   next;
             end if;
          end loop;

0 <= ACC;
             DONE <= '1';
                FLG <= 2;
       end if;
         end if;
   end if;

elsif FLG = 2 then if STB /= '1' then
       FLG <= 2;
    else
       REG1 <= A;
```

FIG. 11C

```
if STB /= '1' then
   FLG <= 3;
else
   REG2 <= A;
   OREG <= OP;

if OP = '0' and REG2 = "00000000" then
       FLG <= 2;
else
 ACC <= REG1;
 while(TRUE) loop
       if OREG = '1' then
          ACC <= ACC + REG2;
    else
          ACC <= ACC - REG2;
    end if;
    REG1 <= SHL(REG1);
    REG2 <= SHR(REG2);
              if( (REG2(7) or REG2(6) or REG2(5)
                 or REG2(4) or REG2(3) or REG2(2)
                 or REG2(1) or REG2(0) ) = '0') then
                 next;
    end if;
 end loop;

0 <= ACC;
    DONE <= '1';
       FLG <= 2;
```

FIG. 11D

```
            end if;
         end if;
      end if;

elsif FLG = 3 then if STB /= '1' then
         FLG <= 3;
      else
         REG2 <= A;
         OREG <= OP;

if OP = '0' nad REG2 = "00000000" then
              FLG <=2;
      else
        ACC <= REG1;
        while(TRUE) loop
              if OREG = '1' then
                 ACC <= ACC + REG2;
           else
                 ACC <= ACC - REG2;
           end if;
           REG1 <= SHL(REG1);
           REG2 <= SHR(REG2);
                     if( (REG2(7) or REG2(6) or REG2(5)
                        or REG2(4) or REG2(3) or REG2(2)
                        or REG2(1) or REG2(0) ) = '0') then
                        next;
           end if;
        end loop;

0 <= ACC;
          DONE <= '1';
                FLG <= 2;
      end if;
         end if;

end if;
   end process;
end;
```

FIG. 17A

```
entity ASIC is
port(A  : in Bit_Vector(7 downto 0);
     OP : in Bit;
     CLK : in Bit;
     STB : in Bit;
     DONE : out Bit;
     O : out Bit_Vector(7 downto 0);
end ASIC;

architecture INSTRUCTION2 of ASIC is type gstates is (G1, G2 G3);
 signal GSTATE : gstates := G1;

signal REG1, REG2, ACC : Bit_Vector(7 downto 0);
 signal OREG : Bit;
 signal CHK : Bit;
begin process
 begin
        wait until GSTATE = G1;
        ACC <= "00000000";
        REG1 <= "00000000";
        REG2 <= "00000000";
        DONE <= '0';
 end process;

process
 begin
        wait until GSTATE = G2;
        if STB = '1' then
          REG1 <= A;
        end if;
 end process;
```

FIG. 17B

```
process
begin
    wait until GSTATE = G3;
    if STB = '1' then
        REG2 <= A;
        OREG <= OP;

if CHK = '0' then
            ACC <= REG1;

while(TRUE) loop
            if OREG = '1' then
                ACC <= ACC + REG2;
            else
                ACC <= ACC + REG2;
            end if;
            REG1 <= SHL(REG1);
            REG2 <= SHR(REG2);
            if ( (REG2(7) or REG2(6) or REG2(5) or REG2(4)
                or REG2(3) or REG2(2) or REG2(1) or REG2(0) = '0') then
                break;
            end if;
        end loop;
        0 <= ACC;
            DONE <= '1';
        end if;
    end if;
end process;

process
```

FIG. 17C

```
begin
 case GSTATE is
 when G1 =>
         GSTATE <=G2;
 when G2 =>
         if STB = '1' then
           GSTATE <=G3;
         else
           GSTATE <=G2;
  end if;
 when G3 =>
         if STB = '1' then
          if OREG = '0' and REG2 = "00000000" then
           CHK <= '1';
                GSTATE <= G3;
      else
           CHK <= '1';
           GSTATE <= G2;
          end if;
         else
           GSTATE <= G3;
   end if;
  end case;
 end process;

end;
```

HARDWARE-SOFTWARE CO-SIMULATION SYSTEM, HARDWARE-SOFTWARE CO-SIMULATION METHOD, AND COMPUTER-READABLE MEMORY CONTAINING A HARDWARE-SOFTWARE CO-SIMULATION PROGRAM

BACKGROUND OF THE INVENTION

1. Field of the Invention

The present invention relates to a hardware-software co-simulation system, a hardware-software co-simulation method, and a computer-readable memory containing a hardware-software co-simulation program, and more particularly to a technology for co-simulating both hardware and software quickly and for verifying software efficiently.

2. Description of the Related Art

FIG. 1 is a block diagram showing a conventional hardware-software co-simulation system. In the conventional hardware-software co-simulation system, register-transfer(RT) level accuracy is required for hardware(HW) oriented verification. Therefore, for a software part, the system uses an RT-level software simulator 13 to perform simulation with input from a small scale software 11, as shown in the figure. This small scale software 11, such as a driver program, of the software to be verified contains only basic instructions with no description of input data from or output data to external units. On the other hand, for a hardware part, the system uses an RT-level hardware simulator 14 to perform simulation with input from an RT-level hardware description 12 describing what the hardware does within one system clock time. Co-simulation of the RT-level software simulator 13 and the RT-level hardware simulator 14 gives a HW verification result 20 for use in verifying the hardware.

The co-simulator with this configuration, primarily designed for verifying the hardware to get RT-level data, takes a huge amount of simulation time because verification for a processor part is also in RT-level. For this reason, a small scale software is used as the input from the software simulator side. Therefore, this configuration is not suitable for software verification.

For software(SW) oriented verification, an instruction-level software simulator 18 executes a verification for a software part by means of the small scale software as well as an application software 16 which includes not only basic Instructions but also external input/output instructions. An instruction-level hardware simulator 19 executes a verification for a hardware part by means of an instruction-level hardware description 23 describing what the hardware does on an instruction basis.

Co-simulation of the instruction-level software simulator 18 and the instruction-level hardware simulator 19 gives an SW verification result 21 for use in verifying the software.

For software oriented verification, hardware simulation at an abstraction degree corresponding to a processor instruction level is enough; this lower-accuracy simulation ensures high-speed simulation. A typical hardware description that is used in this simulation is a behavior-level description.

The problem with this method is that a hardware designer usually creates RT-level description data only, because the current design method is automated on an RT or lower level. This means that creating behavior level description increases the load on the hardware designer. In addition, if behavior-level description data is created successfully, the designer must guarantee that the behavior level description data is equivalent to the corresponding RT level description data. This further increases the load.

To solve this problem, a co-simulator shown in FIG. 2 is disclosed. In this co-simulator, for both software oriented verification and hardware oriented verification, for a software part, the instruction-level software simulator 18 executes instruction-level software simulation by means of the application software program 16 while, for a hardware part, the RT-level hardware simulator 14 executes RT-level hardware simulation by means of the RT-level hardware description 12.

This instruction-level software simulator 18 and the RT-level hardware simulator 14, which differ in the simulation level, cannot work together to perform co-simulation. To convert the level for co-simulation, a level converter 24 is provided. This level converter 24 looks up a data book 25 describing a correspondence between bus cycles of which a processor operates on the basis and signal variations occurred in RT-level to convert an operation in one description into that in another. This conversion allows co-simulation to be performed without creating an instruction-level hardware simulator.

However, the co-simulation system shown in FIG. 2, which has the level converter 24, requires the software part to do instruction-level simulation and, at the same time, the hardware part to do RT-level simulation, simultaneously.

In this system, though the instruction-level software simulator is fast enough for the hardware developer, the RT-level hardware simulator is slow for the software developer, thus degrading the software debugging efficiency.

To perform hardware-software co-simulation quickly, the applicant of the present invention thinks it vital to perform co-simulation for software oriented verification on an instruction level. The applicant also notices that the above problem is caused by the fact that the hardware designer usually creates an RT-level hardware description only, not an instruction-level hardware description.

SUMMARY OF THE INVENTION

In view of the foregoing, It is an object of the present invention to provide a hardware-software co-simulation system, a hardware-software co-simulation method, and a computer-readable memory containing a hardware-software co-simulation program which ensures quick co-simulation for hardware and software oriented verification and which performs software oriented verification efficiently To achieve the above object, it is found that some means are necessary to abstract a description from an RT-level hardware description to convert the resulting description to an instruction level description. After a careful study, the inventor has invented the following.

To achieve the above object, there is provided a hardware/software co-simulation system comprising: a hardware verification module for performing simulation for hardware verification with input from an RT-level processor model and an RT-level hardware description; an abstraction module for abstracting from the RT-level hardware description on a processor input/output instruction operation level and for generating an abstracted description describing an instruction-level hardware description, and a software verification module for performing simulation for software verification with input from an instruction-level processor model and the abstracted description.

In a preferred embodiment of the present invention, the abstraction module abstracts one process from the RT-level hardware description on the processor input/output operation level to generate the abstracted description.

In a preferred embodiment of the present invention, the abstraction module comprises a state transition creating section for creating a state transition graph by analyzing the RT-level hardware description; an ordered sequence creating section for creating an ordered sequence by sequencing a plurality of states into a row with an initial state of the state transition graph first; a loop disconnecting section for disconnecting a loop which is in the state transition graph and which includes input/output operations; a process forming section for sequencing operation descriptions of each state according to the ordered sequence and deleting internal signals to form one process; and an abstracted description generating section for generating the abstracted description by inserting at least one statement which sets a flag at a loop disconnection location and at least one statement which skips subsequent processing.

In a preferred embodiment of the present invention, the loop disconnecting section determines that the input/output operations are included when there is at least one signal assignment statement with an external input pin on a right-hand side or with an external output pin on a left-hand side.

In a preferred embodiment of the present invention, the system further comprises an iteration statement inserting section for inserting an iteration statement at a location where the loop is not disconnected.

In a preferred embodiment of the present invention, the abstraction module abstracts a plurality of processes from the RT-level hardware description on a processor input/output operation level to generate the abstracted description.

In a preferred embodiment of the present invention, the abstraction module comprises a state transition graph creating section for creating a state transition graph by analyzing the RT-level hardware description; an ordered sequence creating section for creating an ordered sequence by sequencing a plurality of states into a row with an initial state of the state transition graph first; a determining section for determining whether a state transition going back toward a beginning of the created ordered sequence is to be deleted or not: a dividing section for dividing the ordered sequence into a plurality of subdivisions according to a destination state of the state transition determined not to be deleted, and an abstracted description generating section for generating the abstracted description by forming an operation description of each of the plurality of subdivisions into one process.

In a preferred embodiment of the present invention, the determining section determines that the state transition going backward is not to be deleted when a closed loop formed by the state transition going backward includes input/output operations and that the state transition going backward is to be deleted when the closed loop does not include input/output operations.

To achieve the above object, there is provided a hardware/software co-simulation method comprising the steps of performing simulation for hardware verification with input from an RT-level processor model and an RT-level hardware description; abstracting from the RT-level hardware description on a processor input/output instruction operation level and for generating an abstracted description describing an instruction-level hardware description; and performing simulation for software verification with input from an instruction-level processor model and the abstracted description.

To achieve the above object, here is provided a computer-readable memory having stored therein a hardware/software co-simulation program, the program comprising a hardware verification process for performing simulation for hardware verification with input from an RT-level processor model and an RT-level hardware description; an abstraction process for abstracting from the RT-level hardware description on a processor input/output instruction operation level and for generating an abstracted description describing an instruction-level hardware description; and a software verification process for performing simulation for software verification with input from an instruction-level processor model and the abstracted description.

The nature, principle and utility of the invention will become more apparent from the following detailed description when read in conjunction with the accompanying drawings.

BRIEF DESCRIPTION OF THE DRAWINGS

In the accompanying drawings:

FIG. 6 is an RT-level hardware description used in the embodiment of the present invention;

FIG. 11 is a diagram showing a hardware description after abstraction in the first embodiment;

FIG. 17 is a diagram showing a hardware description abstracted in the second embodiment.

DESCRIPTION OF THE PREFERRED EMBODIMENTS

A hardware-software co-simulation system, a hardware-software co-simulator method, and a computer-readable memory containing a hardware-software co-simulation program are described below with reference to the drawings.

Figure 1A:
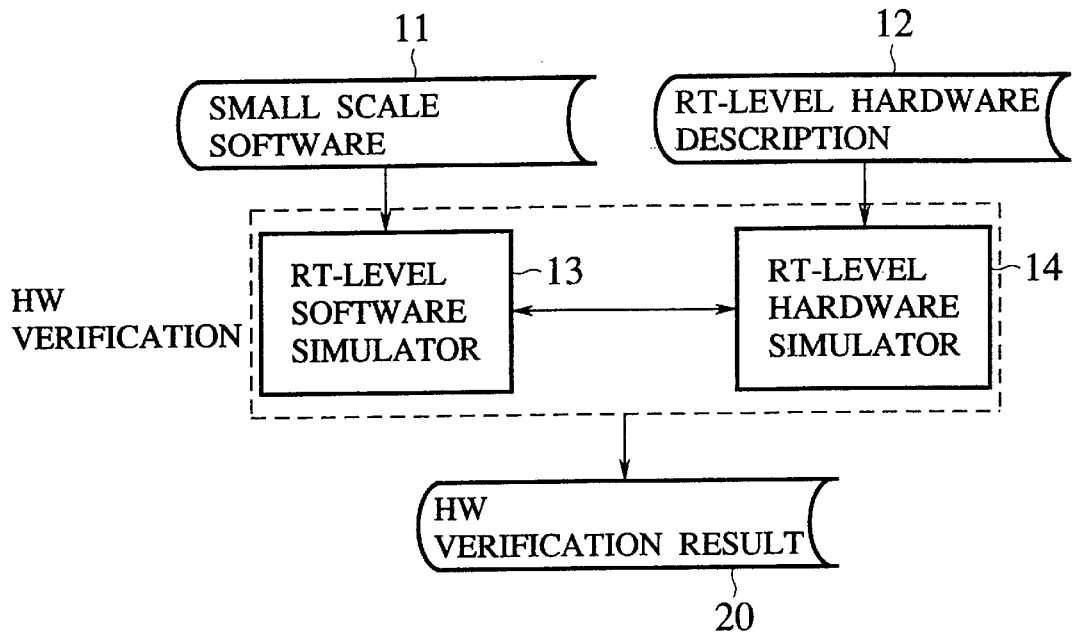
FIGS. 1A and 1B are block diagrams showing a first conventional hardware-software co-simulation system.
Figure 1B:
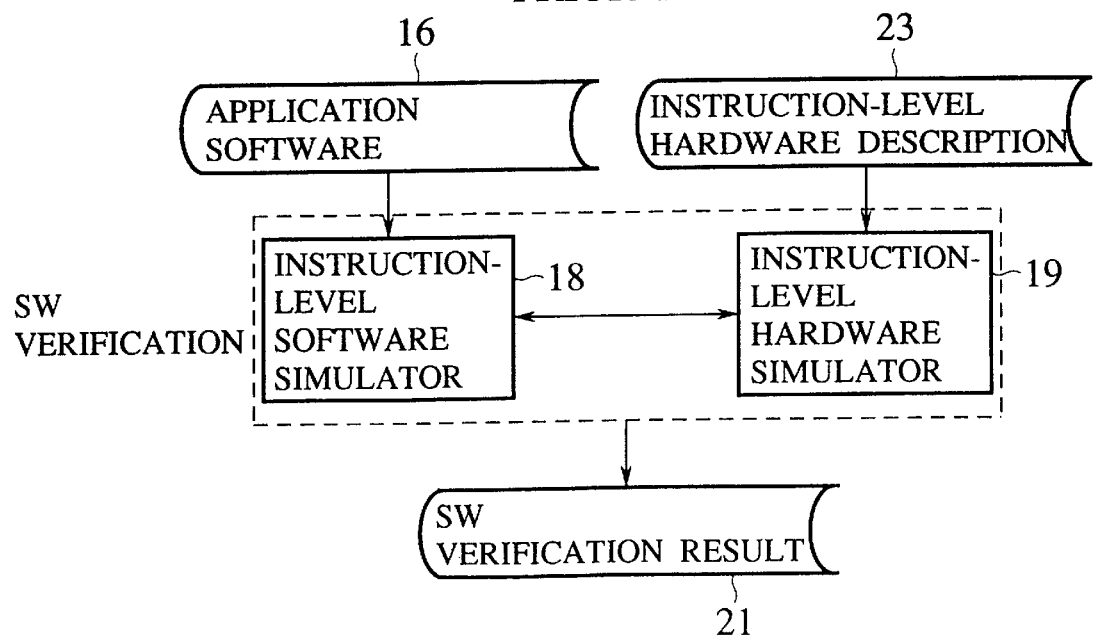
Figure 2:
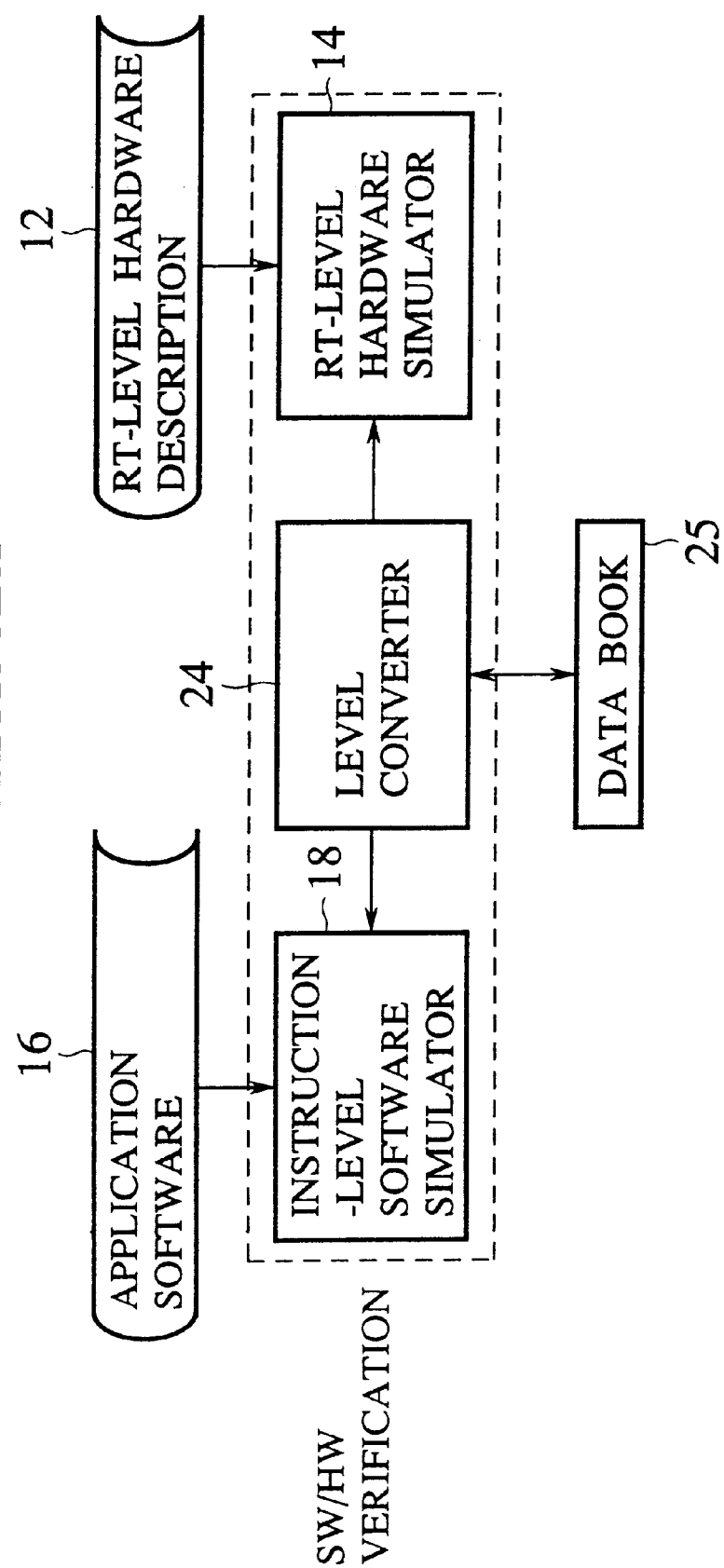
FIG. 2 is a block diagram showing a second conventional hardware-software co-simulation system.
Figure 3:
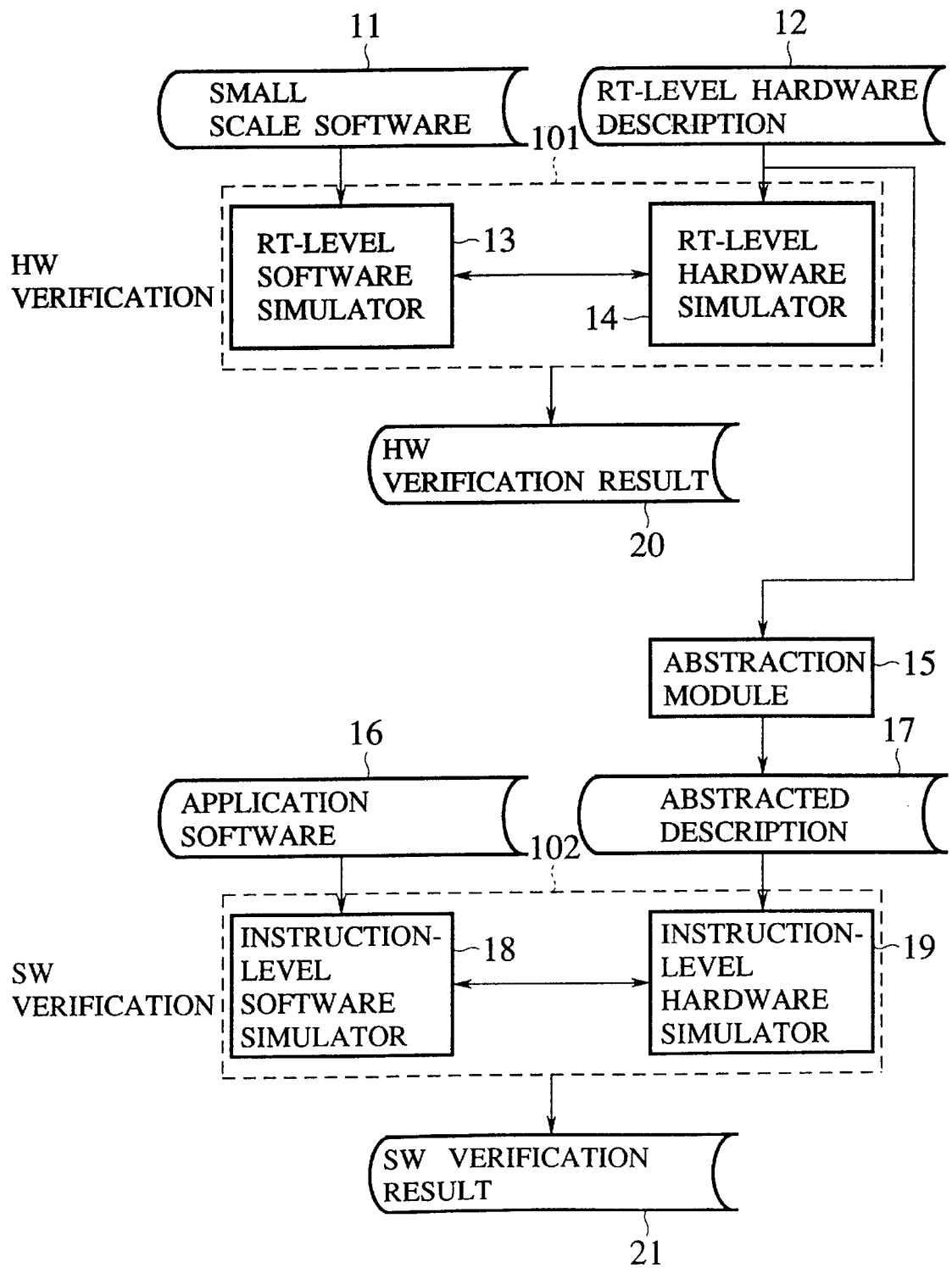
FIG. 3 is a block diagram showing the configuration of an embodiment of a hardware-software co-simulation system according to the present invention.

FIG. 3 is a block diagram showing an embodiment of the hardware-software co-simulation system according to the present invention. The hardware-software co-simulation system used in this embodiment comprises a hardware verification module 101 (13, 14) which performs hardware verification simulation with input from an RT-level processor model and an RT-level hardware description, an abstraction module 15 which abstracts a description from the RT-level hardware description to get a description on the processor I/O instruction operation level, and a software verification module 102 (18, 19) which performs software verification simulation with input from an instruction-level processor model and the abstracted description.

The small scale software 11 shown in FIG. 3 describes only basic operations; it does not describe input/output operations for external units. A driver program is an example of the small scale program 11. The application software program 16 includes not only operations such as those executed by the small scale software but also input/output operations for external units.

When hardware-software co-simulation is started, the RT-level software simulator 13 and the RT-level hardware simulator 14 perform co-simulation for hardware oriented verification. Next, the abstraction module 15 abstracts from the RT-level hardware description 12 on a processor input/output instruction operation level to generate the abstracted description 17. Then, the instruction-level software simulator 18 and the instruction-level hardware simulator 19 perform co-simulation for software oriented verification.

Figure 4:
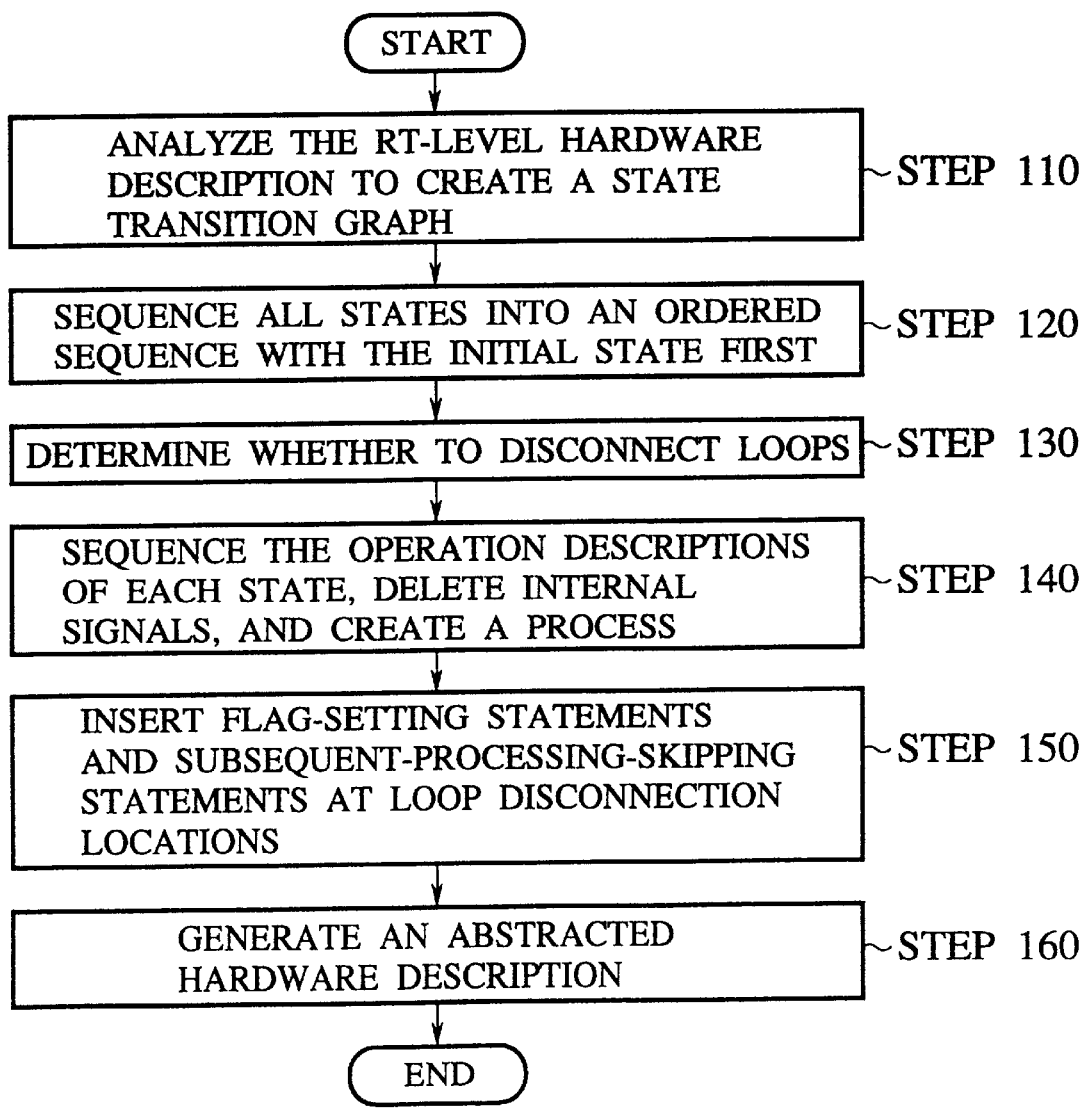
FIG. 4 is a flowchart showing the abstracted-description generation steps of a first embodiment of a hardware-software co-simulation method according to the present invention.

FIG. 4 is a flowchart showing the abstraction description generation steps of a first embodiment of the hardware-software co-simulation method according to the present invention. First, the RT-level hardware description 12 is analyzed in step 110 to create a state transition graph. In step 120, a plurality of states are sequenced into an ordered sequence with the initial state first. In step 130, I/O-related loops are disconnected while reserving non-I/O-related loops. In step 140, the operation descriptions of the states are sequenced into an ordered sequence and the internal signals are deleted to create a process. In step 150, statements which set flags at loop disconnection locations and statements which skip subsequent processing are inserted. In step 160, an abstracted hardware description is generated.

Figure 5:
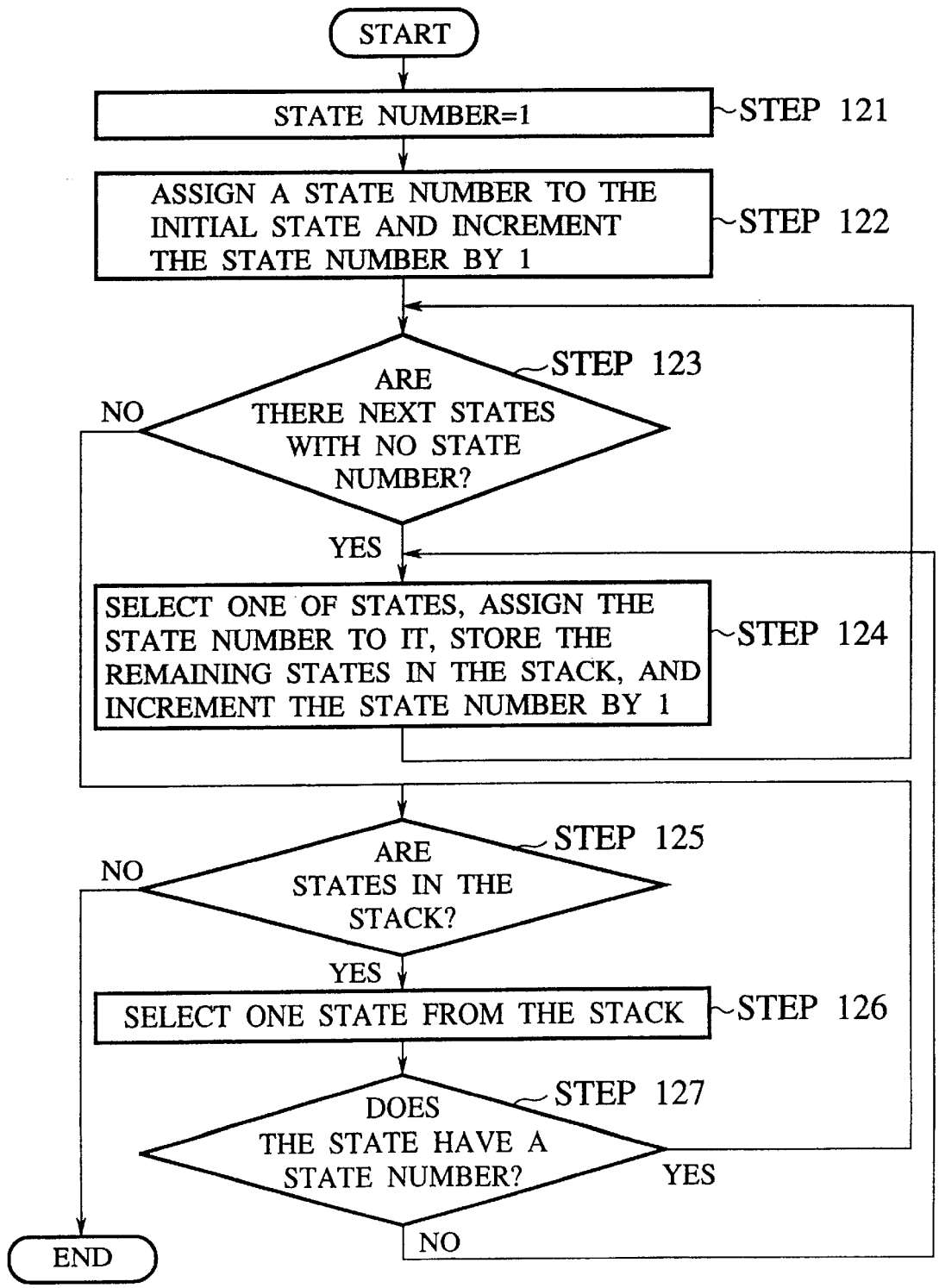
FIG. 5 is a flowchart showing the processing procedure of step 120 in which a plurality of states are sequenced into an ordered sequence.

FIG. 5 is a flowchart showing an algorithm for the sequencing procedure of step 120 in which a plurality of states are sequenced into an ordered sequence. Although the depth-first algorithm is used, the present invention Is not limited to this algorithm. In step 121 of this algorithm, initialization Is performed; that is a variable representing a state number is introduced and the state number is set to 1. In step 122, the state number of 1 is assigned to the initial state. Then, the state number is incremented. In step 123, a check is made to see if there are next states with no state number. If there are next states with no state number, one of them is selected in step 124 and the state number is assigned to it. The remaining states are stored in a stack and the state number is incremented. Control goes back to step 123 to check to see if there are next states with no state number. This is repeated until all the next states have state numbers.

When all the next states have state numbers, control goes to step 125 and a check is made to see if there are states in the stack. If there are states, one of them is selected from the stack in step 126 and a check is made to see, in step 127, if the state has a state number. If the state has no state number, control goes back to step 124, the state number is assigned to the state selected in step 126, the remaining states are stored in the stack, and the state number is incremented. Control goes back to step 123, and a check is made to see if there are next states with no state numbers. Processing is repeated until all the next states have state numbers. Then, control goes to step 125.

On the other hand, if the state has a state number in step 127, control goes back to step 125 to check to see if there are states in the stack. Processing is repeated until all the states in the stack are processed.

FIG. 6 shows the RT-level hardware description 12 used in this embodiment. Because of limited space, this description begins in the top of the left column and ends in the bottom of the right column. This RT-level hardware description 12 has a state declaration part 41, an operation description part 42, and a state transition description part 43. The following explains in detail the operation of the algorithm of the abstraction module 15 shown in FIG. 4, based on the RT-level hardware description 12 shown in FIG. 6.

The state declaration part 41 in the RT-level hardware description 12 shown in FIG. 6 indicates that there are eight states, S1 to S8. Execution of the processing of step 110 for these eight states using the state transition operation description coded in the state transition description part 43 results in a state transition graph shown in FIG. 7. This state transition graph is composed of nodes such as node 51 and edges such as edge 52. Each node represents a state while each edge represents a transition between states. State transition occurs in the direction of the arrow of an edge.

Figure 7:
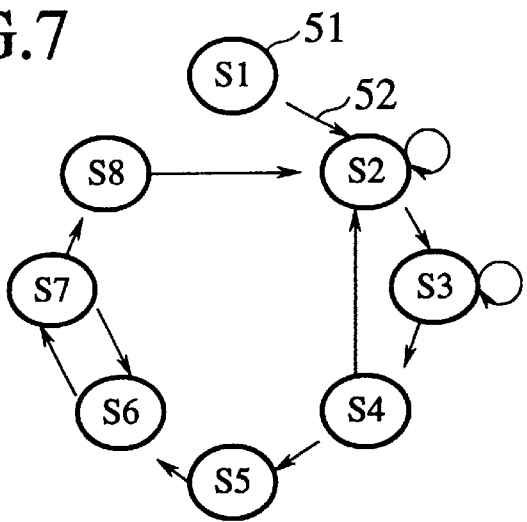
FIG. 7 is a diagram showing a state transition graph.
Figure 8:
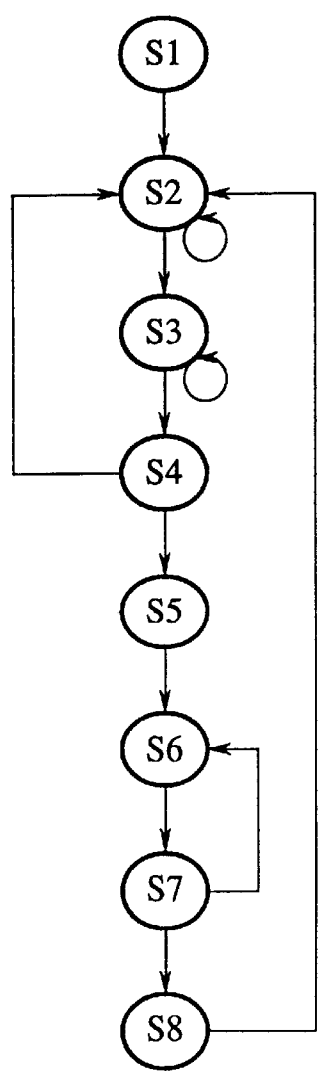
FIG. 8 is a diagram showing a processing result of step 120 in which a plurality of states are sequenced into the ordered sequence.

Then, the processing of step 120 is executed for the state transition graph shown in FIG. 7 to sequence all the states into an ordered sequence with the initial state first. FIG. 8 shows an example of the result obtained by applying the algorithm shown in FIG. 5 to the state transition graph in FIG. 7 to arrange the states in a row.

Figure 9:
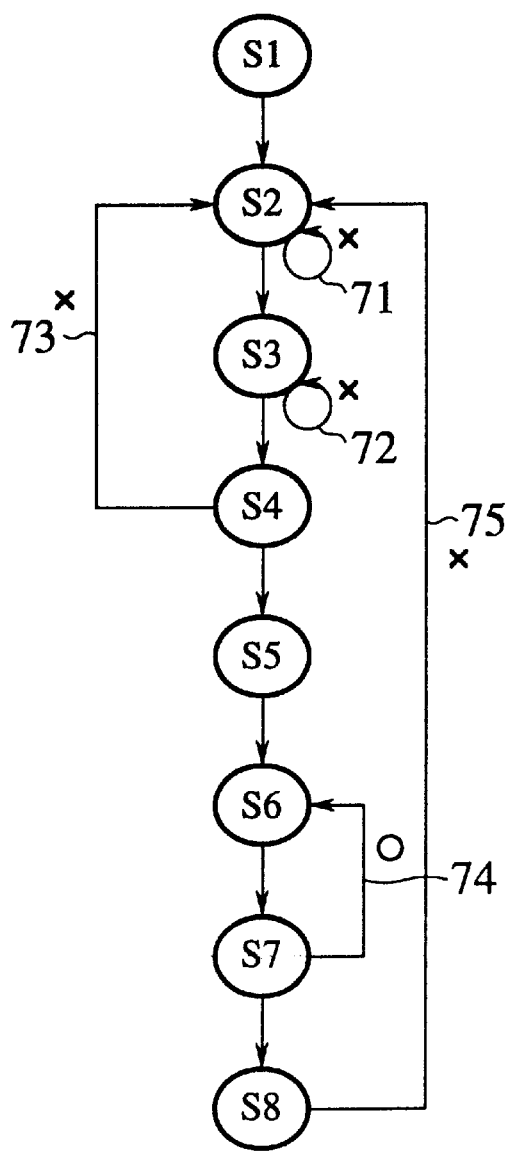
FIG. 9 is a diagram showing a result of the determination of loop disconnection.

The loop disconnection determination processing of step 130 is executed for the state transition graph shown in FIG. 8. FIG. 9 shows the state transition graph after the loop disconnection determination processing of step 130. A loop is determined to be disconnected if it contains an input/output operation, while a loop is determined not to be disconnected if it does not contain an input/output operation. In FIG. 9, state transitions 71 to 75 are loops. The state transition description part 43 in FIG. 6 indicates that state S2 and state S3 contain input operations, meaning that loops 71, 72, 73, and 75 are disconnected. Loop 74, which does not contain an input/output operation, is not disconnected. An input/output operation is indicated by a signal assignment statement having an external input pin on the right-hand side or by a signal assignment statement having an external output pin on the left-hand side. These signal assignment statements are used to determine whether or not an I/O operation is executed.

Figure 10:
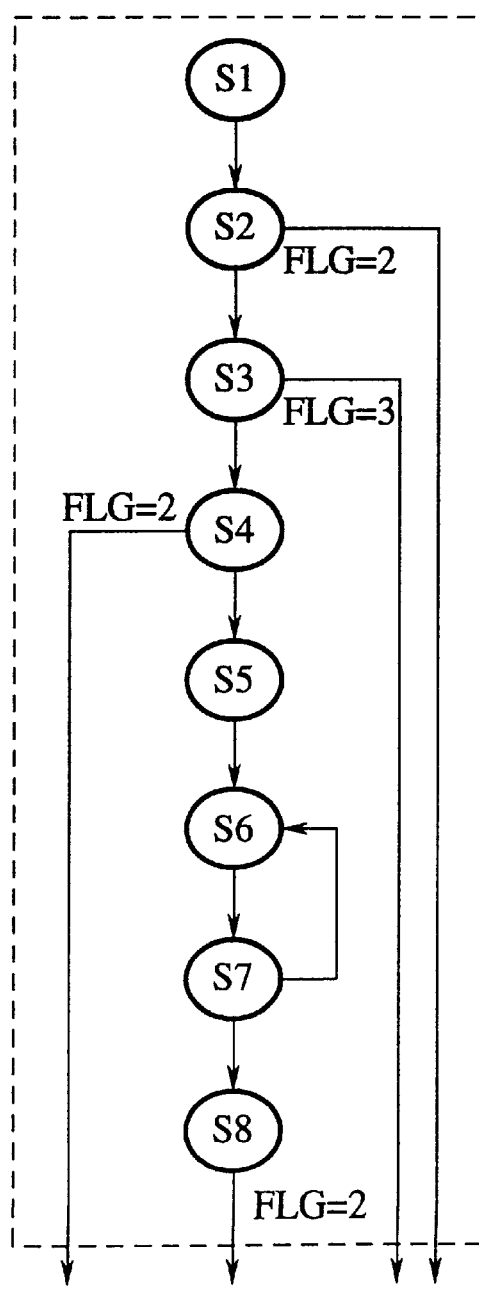
FIG. 10 is a diagram explaining how a plurality of states are grouped into a process.

In step 140, the operation descriptions of each state in the state transition graph in FIG. 9 are sequenced, the internal signals are deleted, and one process is created. In step 150, a flag-setting statement which sets a flag at a loop disconnection location and a subsequent-processing-skipping statement which skips the subsequent processing are inserted into the state transition graph processed in step 140. FIG .10 shows the graph into which flag-setting statements and subsequent-processing-skipping statements have been inserted in step 150. For example, loop 71 in FIG. 9 is deleted and, instead, the flag FLG is set to the value of 2. For a location where the loop is not disconnected, an iteration statement such as a loop statement or a while statement is inserted. After this processing, the graph is changed to one process surrounded by dotted lines as shown in FIG. 10.

After the above processing, an abstracted hardware description is output in step 160 which generates an abstracted hardware description. FIG. 11 shows an example of an abstracted description generated in step 160.

In the above-described abstracted description which is generated by the abstraction module and in which a plurality of states are grouped into one process, all the states are executed in a single event processing operation in the correct sequence. Therefore, as compared with the original RT-level hardware description in which all the states are executed in a plurality of event processing operations, simulation is performed more quickly. Where data must be transferred with a processor, processing is once stopped and the subsequent processing is executed correctly by setting the flags.

Figure 12:
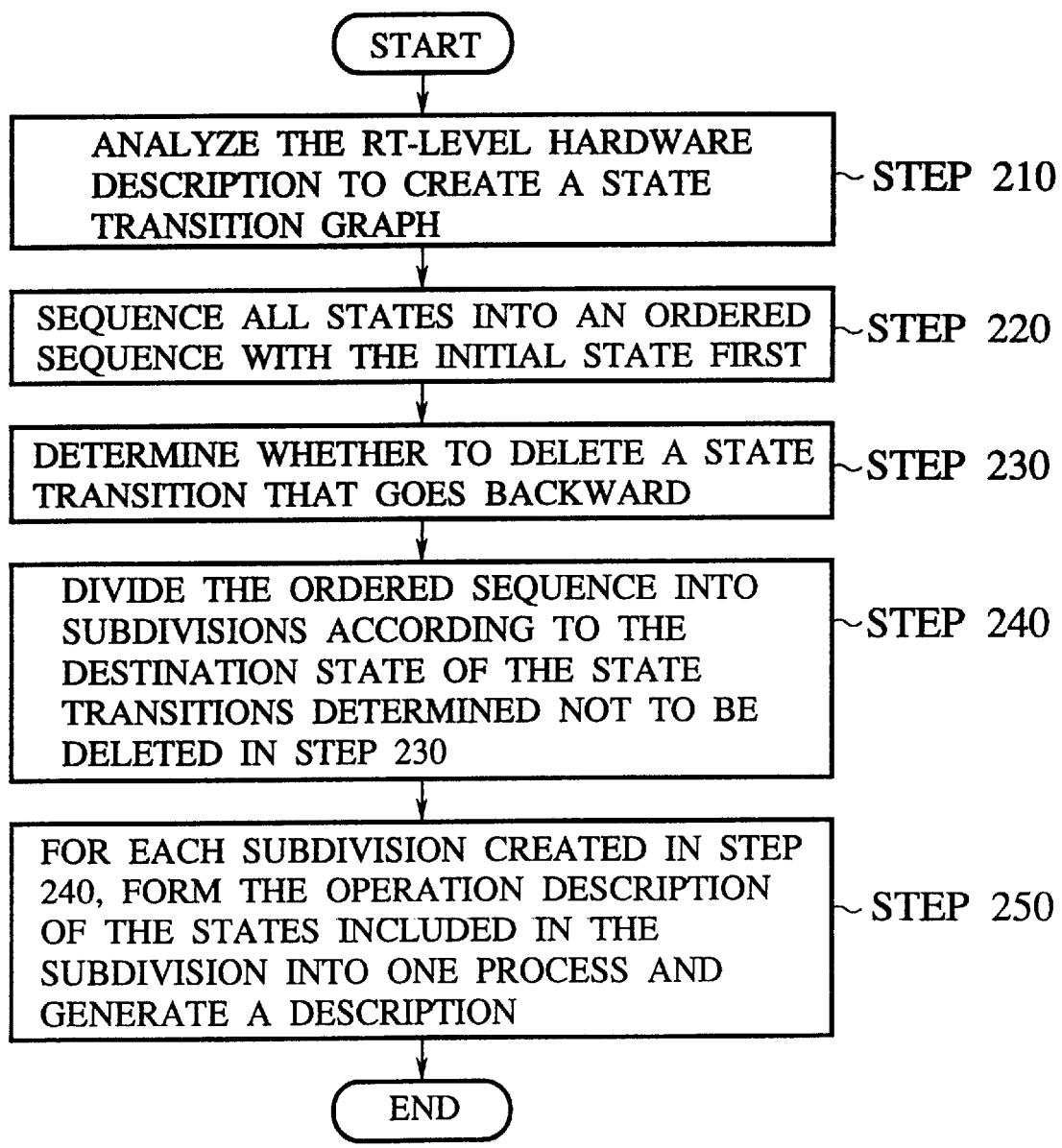
FIG. 12 is a flowchart showing the abstracted-description generation steps of a second embodiment of the hardware-software co-simulation method according to the present invention.

FIG. 12 is a flowchart showing the abstraction description generation steps of a second embodiment of the hardware-software co-simulation method according to the present invention.

Figure 13:
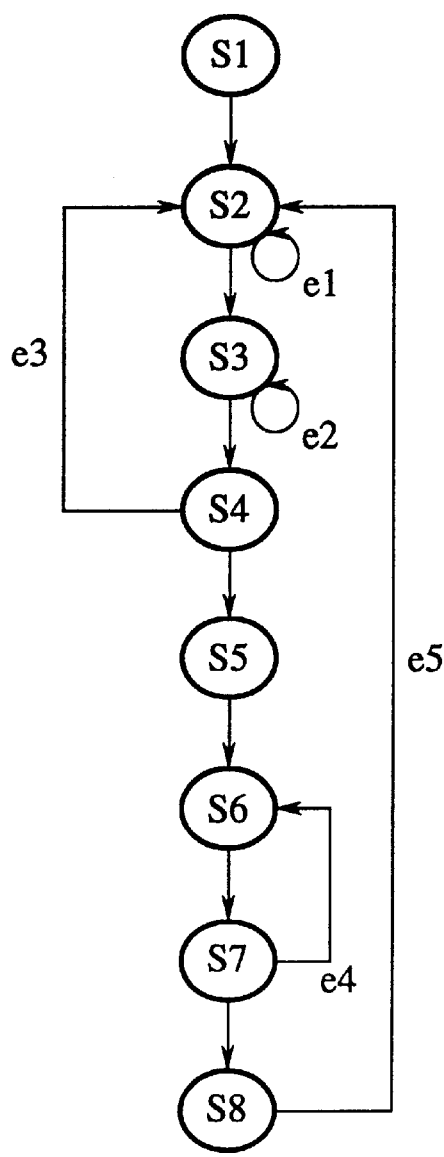
FIG. 13 is a diagram showing a processing result of step 220 in which a plurality of states are sequenced into the ordered sequence.

In step 210, an RT-level hardware description 12 is analyzed to create a state transition graph. FIG. 7 shows a created state transition graph. The description of this processing, which is similar to that in the first embodiment, is omitted here. In step 220, all the states are sequenced into an ordered sequence with the initial state first. The description of the arrangement of the states, which is similar that in the first embodiment, is omitted here. FIG. 13 shows a created ordered sequence.

Figure 14:
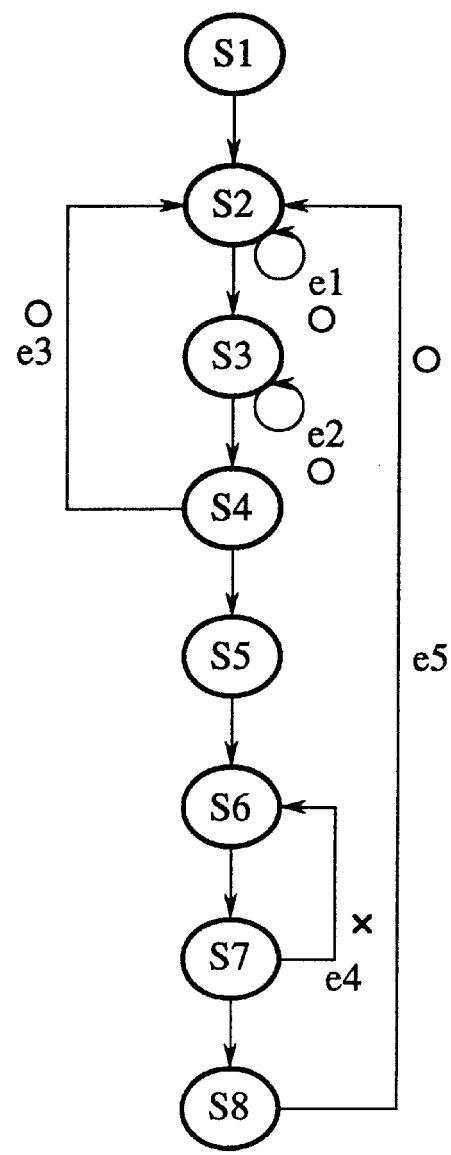
FIG. 14 is a diagram showing a determined result of whether state transitions are to be deleted or not.
Figure 15:
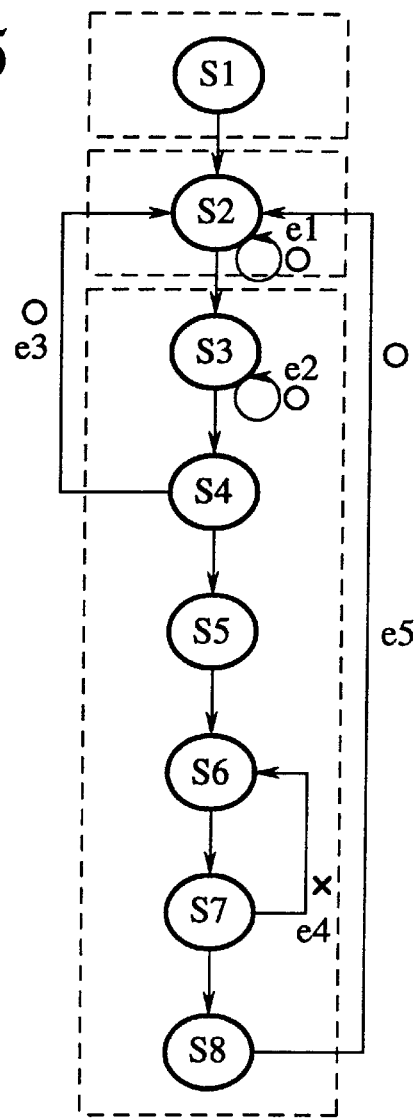
FIG. 15 is a diagram explaining how the ordered sequence is divided into a plurality of processes.

In step 230, a check is made to determine if a state transition that goes backward is to be deleted. This determination is made according to whether or not an input/output operation is included in a closed loop formed by a state transition that goes backward. That is, when an input/output operation is included in the closed loop, the state is not deleted; when an input/output operation its not included, the state is deleted. This is explained with reference to FIG. 13. In FIG. 13, there are five state transitions that go backward: e1, e2, e3, e4, and e5. Of these e1, e2, e3, and e5 include state S2 or state S3 which includes an input/output operation in a closed loop and, therefore, these states are not deleted. On the other hand, state e4 does not include a state in which an input/output operation is executed and, therefore, it is deleted. FIG. 14 shows the determined result. Then, in step 240, the ordered sequence is divided into subdivisions according to the destination state of the state transitions determined in step 230 not to be deleted. FIG. 15 shows a subdivided ordered sequence.

Figure 16:
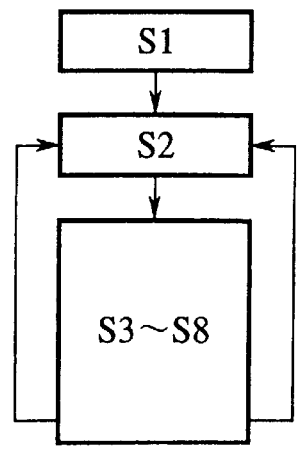
FIG. 16 is a diagram showing the divided state transitions.

Finally, for each subdivision created in step 240, the operation description of the states included in the subdivision is formed into one process and an abstracted description is generated in step 250. FIG. 16 is a diagrams showing the state transition relation among abstracted descriptions, and FIG. 17 shows an example of an abstracted description.

The abstracted description generated in the above steps allows the operations other than those involving input/output operations with a processor, that is, data transfers with a software simulator, to be simulated in a single event processing operation. As compared with the original RT-level hardware description which requires a plurality of event processing operations, the abstracted description generated in the second embodiment of the present invention ensures quick simulation. In addition, as compared with the abstraction method described in the first embodiment, the second embodiment eliminates the need for adding statements for state transition, making it possible to generate a description more efficient than that generated in the first embodiment.

A program that executes the above described hardware/software co-simulation may be stored on a recording medium. With the program from this recording medium, the hardware/software co-simulation method may be executed under control of a computer. The recording medium includes any device capable of storing programs therein such as a memory device, magnetic disk, and optical disk, As explained before, the hardware-software co-simulation system, hardware-software co-simulation method, and computer-readable memory containing a hardware-software co-simulation program according to the present invention generate an abstracted instruction-level description from an RT-level hardware description for simulating the hardware on the instruction-level. This speeds up co-simulation intended for software verification. Therefore, the present invention enables high-speed co-simulation for both hardware and software oriented verification while ensuring the efficiency of software verification.

It should be understood that many modifications and adaptations of the invention will become apparent to those skilled in the art and it is intended to encompass such obvious modifications and changes in the scope of the claims appended hereto.

What is claimed is:

1. A hardware/software co-simulation system comprising:
   a hardware verification module for performing simulation for hardware verification with input from an RT-level processor model and an RT-level hardware description;
   an abstraction module for abstracting from the RT-level hardware description on a processor input/output instruction operation level and for generating an abstracted description describing an instruction level hardware description, and
   a software verification module for performing simulation for software verification with input from an instruction-level processor model and said abstracted description.

2. A hardware/software co-simulation system according to claim 1 wherein said abstraction module abstracts one process from the RT-level hardware description on the processor input/output operation level to generate said abstracted description.

3. A hardware/software co-simulation system according to claim 1 wherein said abstraction module comprises:
   a state transition creating section for creating a state transition graph by analyzing the RT-level hardware description;
   an ordered sequence creating section for creating an ordered sequence by sequencing a plurality of states into a row with an initial state of said state transition graphs first:
   a loop disconnecting section for disconnecting a loop which is in said state transition graph and which includes input/output operations;
   a process forming section for sequencing operation descriptions of each state according to the ordered sequence and deleting internal signals to form one process; and
   an abstracted description generating section for generating said abstracted description by inserting at least one statement which sets a flag at a loop disconnection location and at least one statement which skips subsequent processing.

4. A hardware/software co-simulation system according to claim 3 wherein said loop disconnecting section determines that the input/output operations are included when there is at least one signal assignment statement with an external input pin on a right-hand side or with an external output pin on a left-hand side.

5. A hardware/software co-simulation system according to claim 3, further comprising an iteration statement inserting section for inserting an iteration statement at a location where the loop is not disconnected.

6. A hardware/software co-simulation system according to claim 1 wherein said abstraction module abstracts a plurality of processes from the RT-level hardware description on a processor input/output operation level to generate said abstracted description.

7. A hardware/software co-simulation system according to claim 1 wherein said abstraction module comprises:
 a state transition graph creating section for creating a state transition graph by analyzing the RT-level hardware description;
 an ordered sequence creating section for creating an ordered sequence by sequencing a plurality of states into a row with an initial state of said state transition graph first;
 a determining section for determining whether a state transition going back toward a beginning of said created ordered sequence is to be deleted or not;
 a dividing section for dividing the ordered sequence into a plurality of subdivisions according to a destination state of said state transition determined not to be deleted; and
 an abstracted description generating section for generating said abstracted description by forming an operation description of each of said plurality of subdivisions into one process.

8. A hardware/software co-simulation system according to claim 7 wherein said determining section determines that the state transition going backward is not to be deleted when a closed loop formed by the state transition going backward includes input/output operations and that the state transition going backward is to be deleted when the closed loop does not include input/output operations.

9. A hardware/software co-simulation method comprising the steps of:
 performing simulation for hardware verification with input from an RT-level processor model and an RT-level hardware description;
 abstracting from the RT-level hardware description on a processor input/output instruction operation level and for generating an abstracted description describing an instruction-level hardware description; and
 performing simulation for software verification with input from an instruction-level processor model and said abstracted description.

10. A hardware/software co-simulation method according to claim 9 wherein said abstracting step abstracts one process from the RT-level hardware description on the processor input/output operation level to generate said abstracted description.

11. A hardware/software co-simulation method according to claim 9 wherein said abstracting step comprises the steps of:
 creating a state transition graph by analyzing the RT-level hardware description;
 creating an ordered sequence by sequencing a plurality of states into a row with an initial state of said state transition graph first;
 disconnecting a loop which is in said state transition graph and which includes input/output operations;
 a process forming section for sequencing operation descriptions of each state according to the ordered sequence and deleting internal signals to form one process; and
 generating said abstracted description by inserting at least one statement which sets a flag at a loop disconnection location and at least one statement which skips subsequent processing.

12. A hardware/software co-simulation method according to claim 11 wherein said loop disconnecting step determines that the input/output operations are included when there is at least one signal assignment statement with an external input pin on a right-hand side or with an external output pin on a left-hand side.

13. A hardware/software co-simulation method according to claim 11, further comprising the step of inserting an iteration statement at a location where the loop is not disconnected.

14. A hardware/software co-simulation method according to claim 9 wherein said abstracting step abstracts a plurality of processes from the RT-level hardware description on a processor input/output operation level to generate said abstracted description.

15. A hardware/software co-simulation method according to claim 9 wherein said abstracting step comprises the steps of:
 creating a state transition graph by analyzing the RT-level hardware description;
 creating an ordered sequence by sequencing a plurality of states into a row with an initial state of said state transition graph first;
 determining whether a state transition going back toward a beginning of said created ordered sequence is to be deleted or not;
 dividing the ordered sequence into a plurality of subdivisions according to a destination state of said state transition determined not to be deleted; and
 generating said abstracted description by forming an operation description of each of said plurality of subdivisions into one process.

16. A hardware/software co-simulation method according to claim 15 wherein said determining step determines that the state transition going backward is not to be deleted when a closed loop formed by the state transition going backward includes input/output operations and that the state transition going backward is to be deleted when the closed loop does not include input/output operations.

17. A computer-readable memory having stored therein a hardware/software co-simulation program, said program comprising:
 a hardware verification process for performing simulation for hardware verification with input from an RT-level processor model and an RT-level hardware description;
 an abstraction process for abstracting from the RT-level hardware description on a processor input/output instruction operation level and for generating an abstracted description describing an instruction-level hardware description; and
 a software verification process for performing simulation for software verification with input from an instruction-level processor model and said abstracted description.

18. A computer-readable memory having stored therein a hardware/software co-simulation program according to claim 17 wherein said abstraction process abstracts one process from the RT-level hardware description on the processor input/output operation level to generate said abstracted description.

19. A computer-readable memory having stored therein a hardware/software co-simulation program according to claim 17 wherein said abstraction process comprises:
- a state transition creating process for creating a state transition graph by analyzing the RT-level hardware description;
- an ordered sequence creating process for creating an ordered sequence by sequencing a plurality of states into a row with an initial state of said state transition graph first;
- a loop disconnecting process for disconnecting a loop which is in said state transition graph and which includes input/output operations;
- a process forming process for sequencing operation descriptions of each state according to the ordered sequence and deleting internal signals to form one process; and
- an abstracted description generating process for generating said abstracted description by inserting at least one statement which sets a flag at a loop disconnection location and at least one statement which skips subsequent processing.

20. A computer-readable memory having stored therein a hardware/software co-simulation program according to claim 19 wherein said loop disconnecting process determines that the input/output operations are included when there is at least one signal assignment statement with an external input pin on a right-hand side or with an external output pin on a left-hand side.

21. A computer-readable memory having stored therein a hardware/software co-simulation program according to claim 19, further comprising an iteration statement inserting process for inserting an iteration statement at a location where the loop is not disconnected.

22. A computer-readable memory having stored therein a hardware/software co-simulation program according to claim 17 wherein said abstraction process abstracts a plurality of processes from the RT-level hardware description on a processor input/output operation level to generate said abstracted description.

23. A computer-readable memory having stored therein a hardware/software co-simulation program according to claim 17 wherein said abstraction process comprises:
- a state transition graph creating process for creating a state transition graph by analyzing the RT-level hardware description;
- an ordered sequence creating process for creating an ordered sequence by sequencing a plurality of states into a row with an initial state of said state transition graph first;
- a determining process for determining whether a state transition going back toward a beginning of said created ordered sequence is to be deleted or not;
- a dividing process for dividing the ordered sequence into a plurality of subdivisions according to a destination state of said state transition determined not to be deleted; and
- an abstracted description generating process for generating said abstracted description by forming an operation description of each of said plurality of subdivisions into one process.

24. A computer-readable memory having stored therein a hardware/software co-simulation program according to claim 23 wherein said determining process determines that the state transition going backward is not to be deleted when a closed loop formed by the state transition going backward includes input/output operations and that the state transition going backward is to be deleted when the closed loop does not include input/output operations.

\* \* \* \* \*

UNITED STATES PATENT AND TRADEMARK OFFICE
CERTIFICATE OF CORRECTION

PATENT NO.　：　5,960,182
DATED　　　：　September 28, 1999
INVENTOR(S)：　Yuichiro MATSUOKA, et al It is certified that error appears in the above-identified patent and that said Letters Patent is hereby corrected as shown below:

Title page , insert --[30] Foreign Application Priority Data December 26, 1996 [JP]  8-348532--

Signed and Sealed this

Seventeenth Day of October, 2000

Attest:

Q. TODD DICKINSON

*Attesting Officer*　　　*Director of Patents and Trademarks*